United States Patent
Beaumier et al.

(10) Patent No.: US 8,614,900 B2
(45) Date of Patent: Dec. 24, 2013

(54) GROUNDED LID FOR MICRO-ELECTRONIC ASSEMBLIES

(75) Inventors: Martin Beaumier, Quebec (CA); Alexandre Blander, Montreal (CA); Pascale Gagnon, Bromont (CA); Michael A. Gaynes, Vestal, NY (US); Eric Giguere, Granby (CA); Eric Salvas, Otterburn Park (CA); Luc Tousignant, Chambly (CA)

(73) Assignee: International Business Machines Corporation, Armonk, NY (US)

( * ) Notice: Subject to any disclaimer, the term of this patent is extended or adjusted under 35 U.S.C. 154(b) by 261 days.

(21) Appl. No.: 13/110,175

(22) Filed: May 18, 2011

(65) Prior Publication Data

US 2011/0292621 A1    Dec. 1, 2011

(30) Foreign Application Priority Data

May 28, 2010    (CA) ..................... 2704683

(51) Int. Cl.
H05K 9/00    (2006.01)
H05K 1/00    (2006.01)
H05K 1/18    (2006.01)
H05K 7/00    (2006.01)

(52) U.S. Cl.
USPC .......................................... 361/818; 361/748

(58) Field of Classification Search
None
See application file for complete search history.

(56) References Cited

U.S. PATENT DOCUMENTS

| | | | | |
|---|---|---|---|---|
| 4,678,716 A * | 7/1987 | Tzeng | | 428/551 |
| 5,500,789 A * | 3/1996 | Miller et al. | | 361/816 |
| 5,763,824 A * | 6/1998 | King et al. | | 174/374 |
| 5,847,938 A * | 12/1998 | Gammon | | 361/816 |
| 5,931,222 A | 8/1999 | Toy et al. | | |
| 5,991,162 A * | 11/1999 | Saso | | 361/760 |
| 6,233,153 B1 * | 5/2001 | Baur et al. | | 361/752 |
| 6,239,359 B1 * | 5/2001 | Lilienthal et al. | | 174/370 |
| 6,263,193 B1 * | 7/2001 | Iseki et al. | | 455/84 |
| 6,377,464 B1 * | 4/2002 | Hashemi et al. | | 361/760 |
| 6,451,155 B1 | 9/2002 | Toy et al. | | |
| 6,538,319 B2 * | 3/2003 | Terui | | 257/704 |
| 6,538,896 B2 * | 3/2003 | Kameda et al. | | 361/752 |
| 6,570,086 B1 * | 5/2003 | Shimoji et al. | | 174/377 |
| 6,613,184 B1 | 9/2003 | Egitto et al. | | |
| 6,674,645 B2 * | 1/2004 | Anzai et al. | | 361/752 |
| 6,747,350 B1 * | 6/2004 | Lin et al. | | 257/704 |
| 6,845,014 B2 * | 1/2005 | Wakabayashi et al. | | 361/719 |
| 6,967,403 B2 * | 11/2005 | Chuang et al. | | 257/717 |
| 7,126,217 B2 * | 10/2006 | Chiu et al. | | 257/704 |
| 7,129,422 B2 * | 10/2006 | Arnold | | 174/377 |
| 7,790,988 B2 * | 9/2010 | Tanaka et al. | | 174/564 |
| 7,813,145 B2 * | 10/2010 | Stoneham et al. | | 361/818 |
| 2002/0172022 A1 | 11/2002 | DiBene, II et al. | | |
| 2003/0161109 A1 * | 8/2003 | Kurihara et al. | | 361/709 |
| 2004/0135238 A1 * | 7/2004 | Radu et al. | | 257/678 |
| 2004/0137972 A1 * | 7/2004 | Kishimoto | | 455/575.8 |

(Continued)

*Primary Examiner* — Jinhee Lee
*Assistant Examiner* — Xanthia C Cunningham
(74) *Attorney, Agent, or Firm* — L. Jeffrey Kelly; Matthew C. Zehrer (57) ABSTRACT

An apparatus for reducing EMI at the micro-electronic-component level includes a substrate having a ground conductor integrated therein. A micro-electronic component such as an integrated circuit is mounted to the substrate. An electrically conductive lid is mounted to the substrate, thereby forming a physical interface with the substrate. The electrically conductive lid substantially covers the micro-electronic component. A conductive link is provided to create an electrical connection between the electrically conductive lid and the ground conductor at the physical interface.

18 Claims, 7 Drawing Sheets

(56) References Cited

U.S. PATENT DOCUMENTS

| | | | |
|---|---|---|---|
| 2004/0156178 A1* | 8/2004 | Yamamoto et al. | 361/794 |
| 2005/0052853 A1* | 3/2005 | Hsu et al. | 361/752 |
| 2005/0168952 A1* | 8/2005 | Chen et al. | 361/704 |
| 2006/0012969 A1* | 1/2006 | Bachman | 361/816 |
| 2006/0272857 A1* | 12/2006 | Arnold | 174/377 |
| 2007/0082421 A1* | 4/2007 | Minervini | 438/50 |
| 2007/0109737 A1* | 5/2007 | Kriege et al. | 361/683 |
| 2008/0037238 A1* | 2/2008 | Kimata et al. | 361/818 |
| 2008/0283602 A1* | 11/2008 | Fagrenius et al. | 235/441 |
| 2009/0080167 A1* | 3/2009 | Kishida et al. | 361/752 |
| 2009/0091904 A1* | 4/2009 | Hatanaka et al. | 361/764 |

* cited by examiner

GROUNDED LID FOR MICRO-ELECTRONIC ASSEMBLIES

BACKGROUND

The present invention relates to apparatus and methods for mitigating electromagnetic interference (EMI) in electrical circuits.

Electrical circuits such as integrated circuits are used in a wide variety of different environments. As a result, special efforts are needed to develop electrical circuits that can function properly in their intended operational environments. Many electrical circuits operate in harsh and/or noisy environments, which can lead to issues with electromagnetic interference (EMI). EMI may include any unwanted, spurious, conducted, or radiated signal that can cause an undesired degradation in the performance of an electrical circuit. Electromagnetic compatibility (EMC), on the other hand, is the ability of an electrical circuit to function as designed, without malfunctioning or exhibiting unacceptable performance degradation as a result of EMI that may be present in its operating environment. Examples of EMI performance degradation include a computing device interfering with FM radio reception or an automobile radio system buzzing upon passing under a power line. In general, electrical circuits should be designed such that they do not generate EMI in amounts that adversely affect the performance of other electrical circuits in their vicinity and vice versa.

In the United States, Congress has granted the Federal Communications Commission (FCC) authority to regulate the susceptibility of electrical circuits to EMI in the U.S. The FCC also regulates the amount of EMI that electrical circuits are allowed to generate in the U.S. Special efforts are needed to ensure that electrical circuits comply with these regulations. As a result, controlling and mitigating EMI is a key consideration when designing many electrical circuits.

In view of the foregoing, what are needed are apparatus and methods to mitigate EMI emitted from electrical circuits such as integrated circuits. Ideally, such apparatus and methods would be able to reduce EMI directly at the micro-electronic-component level, such as at the integrated-circuit level.

BRIEF SUMMARY

According to one embodiment of the present invention, an apparatus for reducing EMI at the micro-electronic-component level includes a substrate having a ground conductor integrated therein. The apparatus includes a micro-electronic component mounted to the substrate. The apparatus further includes an electrically conductive lid mounted to the substrate and thereby forming a physical interface with the substrate, the electrically conductive lid substantially covering the micro-electronic component. The apparatus also includes a conductive link creating an electrical connection between the electrically conductive lid and the ground conductor at the physical interface.

According to another embodiment of the present invention, a method for reducing EMI at the micro-electronic-component level includes providing a substrate having a ground conductor integrated therein. The method includes mounting a micro-electronic component to the substrate. The method further includes mounting an electrically conductive lid to the substrate and thereby forming a physical interface, the electrically conductive lid substantially covering the micro-electronic component. The method also includes electrically connecting the electrically conductive lid to the ground conductor at the physical interface.

According to another embodiment of the present invention, an apparatus for reducing EMI at the micro-electronic-component level includes a substrate having a ground conductor integrated therein. The apparatus includes a micro-electronic component mounted to the substrate. The apparatus further includes an electrically conductive lid mounted to the substrate and thereby forming a physical interface with the substrate, the electrically conductive lid substantially covering the micro-electronic component. The apparatus also includes a conductive link creating an electrical connection between the electrically conductive lid and the ground conductor at the physical interface, the conductive link comprising a solder layer attached to the ground conductor, and an electrically conductive adhesive attaching the solder layer to the electrically conductive lid.

BRIEF DESCRIPTION OF THE DRAWINGS

The present invention is described in the detailed description below, in reference to the accompanying drawings that depict non-limiting examples of exemplary embodiments of the present invention.

DETAILED DESCRIPTION

The present invention provides apparatus and methods for reducing EMI directly at the micro-electronic-component level. It will be readily understood that the components of the present invention, as generally described and illustrated in the drawings herein, could be arranged and designed in a wide variety of different configurations. Thus, the following more detailed description of the embodiments of the invention, as represented in the drawings, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

Figure 1:
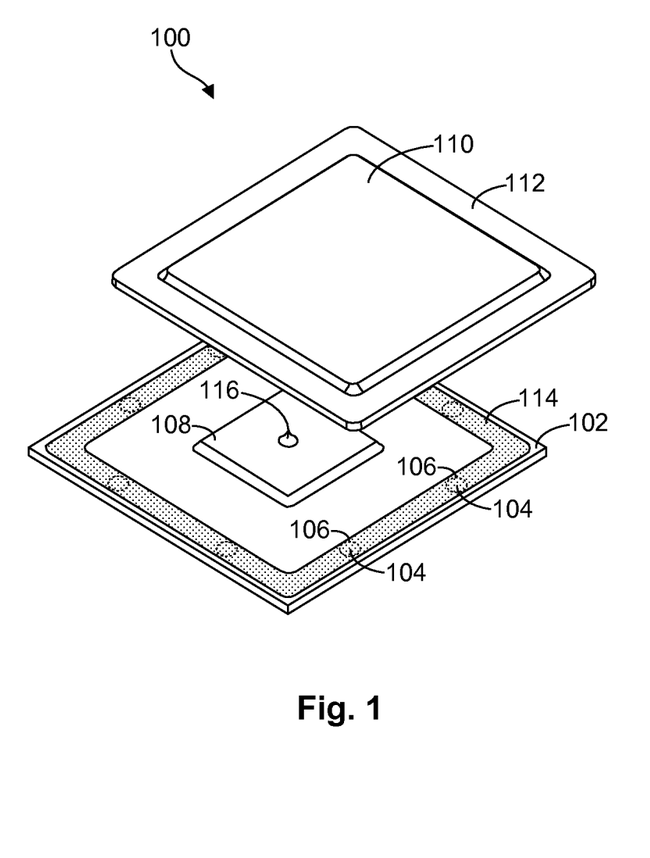
FIG. 1 is a perspective view of one embodiment of a micro-electronic assembly capable of reducing EMI at the micro-electronic-component level.

Referring to FIG. 1, one embodiment of a micro-electronic assembly 100 (or apparatus 100) capable of reducing EMI at the micro-electronic-component level is illustrated. As shown, the micro-electronic assembly 100 includes a substrate 102 having a ground conductor 104 (such as a ground plane or traces or wiring connected to a ground place) integrated therein. In certain embodiments, the ground conductor 104 is embedded in the substrate 102 and covered with a solder resist layer. In such embodiments, the ground conductor 104 may be exposed through one or more openings 106 (represented by the dotted lines) in the solder resist layer. In this example, the ground conductor 104 is exposed through eight circular openings 106 distributed around the substrate 100, although other numbers, shapes, and/or sizes of openings 106 are also possible.

As shown, a micro-electronic component 108, such as a silicon die 108 containing an integrated circuit, may be mounted to the substrate 102. When operating, this micro-electronic component 108 may generate and radiate EMI. This EMI may be the result of transient currents or voltages generated by clocks, transistors, or other switching logic inside the micro-electronic component 108, although other sources of EMI may be present as well.

To reduce the EMI that is radiated by the micro-electronic component 108, an electrically conductive lid 110 may be placed over the micro-electronic component 108 to shield the EMI. When grounded, this electrically conductive lid 110 may act as a Faraday cage to reduce EMI emissions from the micro-electronic component 108. In certain cases, the conductive lid 110 may also serve to shield the micro-electronic component 108 from external EMI, thereby preventing or reducing malfunctions or performance degradation caused by EMI. Thus, in selected embodiments, the electrically conductive lid 110 may improve the micro-electronic component's electromagnetic compatibility (EMC) with other electronic devices.

In certain embodiments, the electrically conductive lid 110 includes a flange 112 extending around an outer periphery of the lid 110. This flange 112 may form a physical interface with the substrate 102. In selected embodiments, a thermally conductive paste 116 may be placed between the micro-electronic component 108 and the electrically conductive lid 110. This allows the lid 110 to also act as a heat sink to dissipate heat produced by the micro-electronic component 108. To perform this function, the lid 110 may be fabricated from a material having suitable electrical and thermal conductivity, such as aluminum or copper.

To attach the electrically conductive lid 110 to the substrate 102 and create a conductive link therebetween, a solder layer may be deposited on the exposed ground conductor 104. After depositing the solder layer, an electrically conductive adhesive 114 (such as a resin-based adhesive filled with an electrically conductive material such as silver) may be used to attach the electrically conductive lid 110 to the substrate 102. In certain embodiments, the electrically conductive adhesive 114 is deposited to form a ring around the micro-electronic component 108, although this is not mandatory. This electrically conductive adhesive 114 may create a conductive link between the electrically conductive lid 110 and the solder layer on the ground conductor 104, thereby grounding the electrically conductive lid 110. This allows the electrically conductive lid 110 to be grounded at the physical interface between the lid 110 and the substrate 102 as opposed to being grounded using external wires, clips, or other grounding elements. This provides an elegant and potentially completely concealed solution for grounding the lid 110.

Another possible benefit of the lid-grounding technique disclosed herein is that the electrically conductive adhesive 114 may improve the Faraday cage that is created around the micro-electronic component 108. That is, by using an electrically conductive adhesive 114 and depositing the electrically conductive adhesive 114 around the micro-electronic component 108 in the form of a ring, as well as ensuring that the electrically conductive adhesive 114 is connected to ground, the electrically conductive adhesive 114 may prevent EMI or other unwanted signals from leaking through the physical interface between the electrically conductive lid 110 and the substrate 102, thereby potentially improving the Faraday cage.

In certain embodiments, instead of forming a continuous ring around the micro-electronic component 108, one or more gaps may be formed in the electrically conductive adhesive 114. These gaps may act as vents to allow gases to escape from inside the micro-electronic assembly 100 as adhesives or other elements inside the micro-electronic assembly 100 dry and/or cure. Thus, in certain embodiments, the ring is discontinuous or broken at selected locations to enable the internal compartment of the micro-electronic assembly 100 to be vented to the outside environment.

Figure 2:
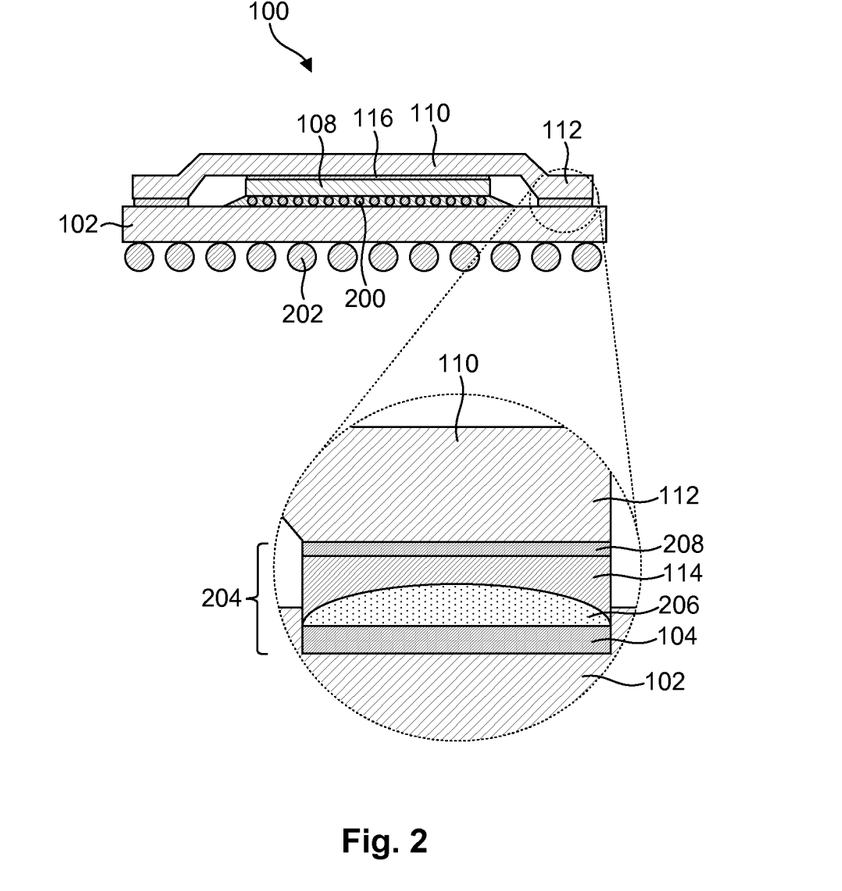
FIG. 2 is one possible cross-sectional side view of the apparatus of FIG. 1.

Referring to FIG. 2, one possible cross-sectional side view of the micro-electronic assembly of FIG. 1 is illustrated. As shown, the micro-electronic assembly 100 includes a substrate 102 having a ground conductor 104 integrated therein. A micro-electronic component 108, such as a silicon die 108 containing an integrated circuit, is mounted to the substrate 102. In certain embodiments, a ball grid array (BGA) 200 may electrically and physically connect the micro-electronic component 108 to the substrate 102, although other methods for electrically connecting the micro-electronic component 108 to the substrate 102 are also possible. Similarly, a ball grid array (BGA) 202 may electrically and physically connect the micro-electronic assembly 100 to external components, such as printed circuit boards (PCBs). Other types of surface-mount packaging may also be used and are within the scope of the present invention.

To reduce the EMI that is radiated by the micro-electronic component 108, an electrically conductive lid 110 is placed over the micro-electronic component 108. As previously mentioned, a thermally conductive paste 116 may be placed between the micro-electronic component 108 and the electrically conductive lid 110 to transfer heat therebetween. As shown, the electrically conductive lid 110 includes a flange 112 that forms a physical interface 204 with the substrate 102. In certain embodiments, the electrically conductive lid 110 may be fabricated from a base material (e.g., copper) that is plated with another material 208 (e.g., nickel).

To attach the electrically conductive lid 110 to the substrate 102 and create a conductive link therebetween, a solder layer 206 may be deposited on the ground conductor 104 where it is exposed on the substrate 102. The solder layer 206 may improve the electrical connection between the electrically conductive adhesive 114 and the ground conductor 104. Once the solder layer 206 is deposited, the electrically conductive adhesive 114 may be used to attach the electrically conductive lid 110 (and more specifically the coating 208 of the lid 110) to the solder layer 206. In addition to physically attaching the lid 100 to the substrate 102, the electrically conductive adhesive 114 creates a conductive link between the electrically conductive lid 110 and the solder layer 206 to thereby ground the lid 110. In selected embodiments, the conductive link between the lid 110 and the substrate 102 may be substantially (although not necessarily) concealed within the physical interface 204.

In one example of a micro-electronic assembly 100, the electrically conductive lid 110 may be a copper lid 110 that is plated with nickel 208. The nickel coating 208 may improve aesthetics and prevent or reduce oxidation of the underlying copper. The ground conductor 104 may be made of copper. The solder layer 206 deposited on the ground conductor 104 may be a lead-free solder such as a SAC (Sn—Ag—Cu) solder, although lead-based solders are also possible. If a SAC solder is used, the SAC solder may comprise about 3 percent silver, 0.5 percent copper, and 96.5 percent tin by weight, although the proportions may be varied. The electrically conductive adhesive 114 may include a resin-based adhesive filled with an electrically conductive material, such as a silver-filled resin or epoxy 114. These materials are presented only by way of example and are not intended to be limiting. Other variations, modification, or substitutions are possible and within the scope of the present invention.

Figure 3:
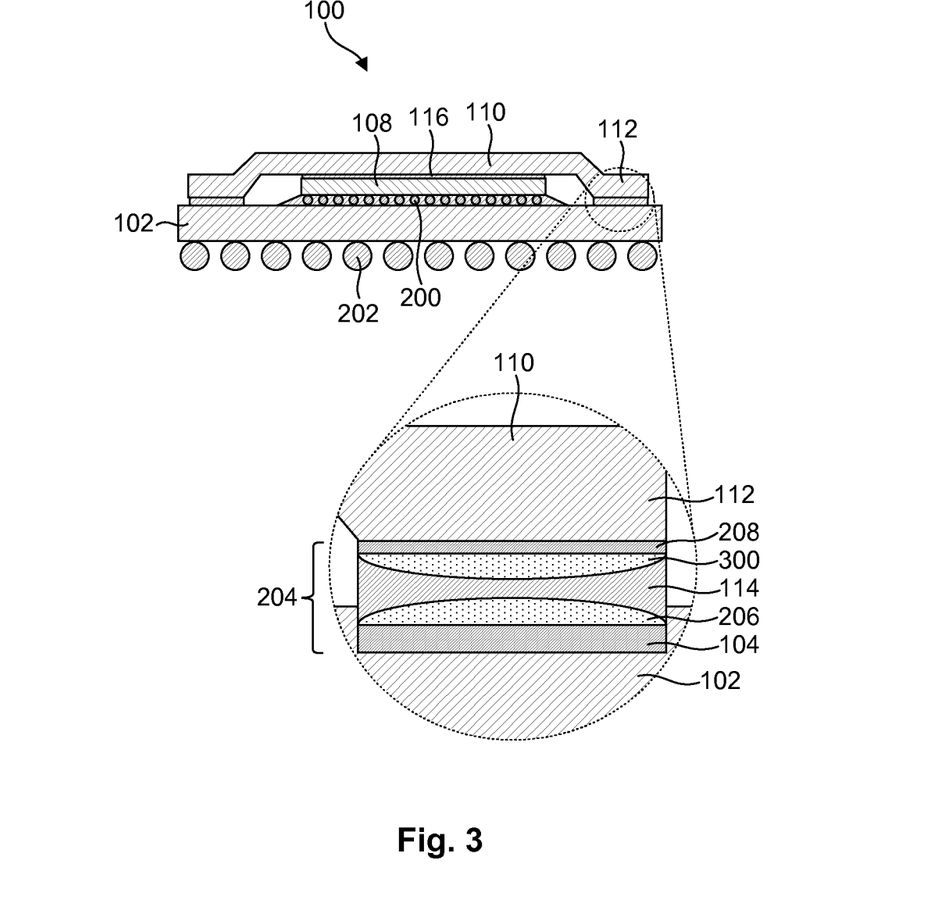
FIG. 3 is an alternative cross-sectional side view of the apparatus of FIG. 1.

Referring to FIG. 3, an alternative cross-sectional side view of the micro-electronic assembly 100 of FIG. 1 is illustrated. This embodiment is similar to that illustrated in FIG. 2 except that an additional solder layer 300 is attached to the lid 110 (and more specifically to the coating 208 of the lid 110, if a coating 208 is present). This additional solder layer 300 may be provided in cases where the electrically conductive adhesive 114 may not form an adequate electrical connection with the lid 110, but the solder layer 300 forms a satisfactory electrical connection and physical bond with both the lid 110 and the electrically conductive adhesive 114. Whether the solder layer 300 is needed may depend on the material used to fabricate the lid 110. In such embodiments, the solder layer 300 may serve a similar function to the solder layer 206 deposited on the ground conductor 104. The solder layers 206, 300 may be separated some distance from one another or be touching. In other embodiments, the solder layers 206, 300 may be merged to form a single continuous solder layer between the ground conductor 104 and the electrically conductive lid 110.

Figure 4:
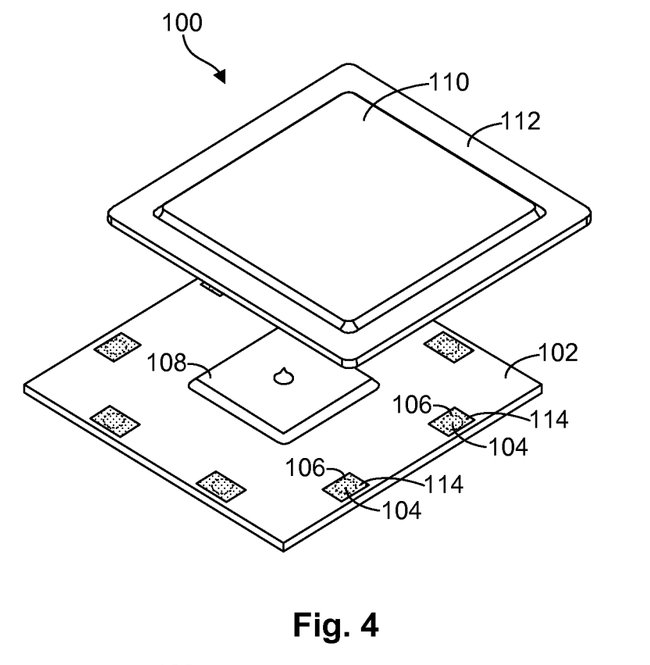
FIG. 4 is a perspective view of an alternative embodiment of a micro-electronic assembly capable of reducing EMI at the micro-electronic-component level.

Referring to FIG. 4, an alternative embodiment of a micro-electronic assembly 100 for reducing EMI at the micro-electronic-component level is illustrated. In this embodiment, instead of depositing the electrically conductive adhesive 114 as a ring around the micro-electronic component 108, the electrically conductive adhesive 114 is deposited primarily at or near the locations where the ground conductor 104 is exposed. In this example, the ground conductor 104 (and associated solder layer 206) is exposed through eight circular openings 106. The electrically conductive adhesive 114 is deposited primarily over or near the openings 106. Other numbers, shapes, and/or sizes of openings 106 are possible. This configuration is effective to create a conductive link between the electrically conductive lid 110 and the ground conductor 104 and thereby ground the electrically conductive lid 110.

Figure 5:
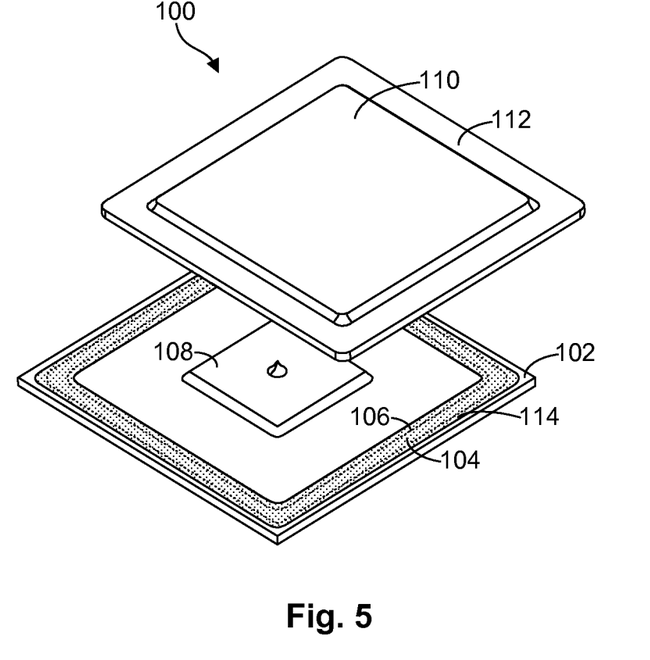
FIG. 5 is a perspective view of another alternative embodiment of a micro-electronic assembly capable of reducing EMI at the micro-electronic-component level.

Referring to FIG. 5, another alternative embodiment of a micro-electronic assembly 100 for reducing EMI at the micro-electronic-component level is illustrated. In this embodiment, the electrically conductive adhesive 114 is deposited in the form of a ring around the micro-electronic component 108. However, unlike the previous embodiments, the opening 106 exposing the ground conductor 104 and associated solder layer 206 is in the form of a ring around the micro-electronic component 108. Thus, the ground conductor 104 may, in some embodiments, be exposed such that it completely surrounds the micro-electronic component 108.

Figure 6:
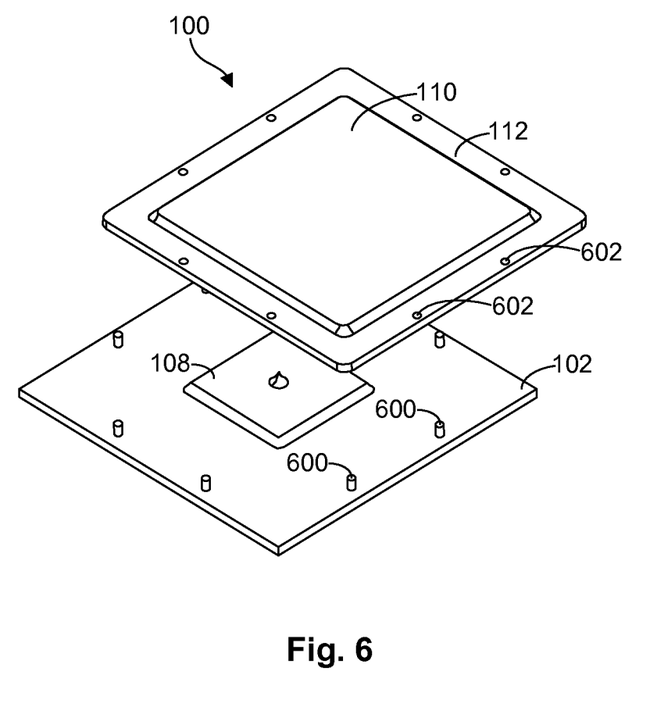
FIG. 6 is a perspective view of yet another alternative embodiment of a micro-electronic assembly capable of reducing EMI at the micro-electronic-component level.

Referring to FIG. 6, yet another alternative embodiment of a micro-electronic assembly 100 for reducing EMI at the micro-electronic-component level is illustrated. In this embodiment, one or more electrically conductive posts (such as solder posts) are electrically connected to the ground conductor 104 and exposed through one or more openings (not shown). Similarly, the electrically conductive lid 110 may include one or more apertures 602 to receive the solder posts 600, thereby electrically connecting the lid 110 to the ground conductor 104. After placing the apertures 602 over the solder posts 600, the solder posts 600 may, in certain embodiments, be melted and cooled to physically join the lid 110 to the substrate 102. Alternatively, the ends of the posts 600 may be deformed (e.g., expanded) using mechanical force to keep the electrically conductive lid 110 firmly attached to the substrate 102.

In selected embodiments, an electrically conductive adhesive 114 (or non-electrically conductive adhesive, for that matter) may be used in conjunction with the electrically conductive posts 600. That is, the lid 110 may be slipped over the electrically conductive posts 600 and the adhesive 114 may keep the lid 110 in place. If an electrically conductive adhesive 114 is used, the electrically conductive adhesive 114 may improve the electrical connection between the lid 110 and the electrically conductive posts 600. In other embodiments, instead of posts 600, electrically conductive balls or other shapes may be used.

Figure 7:
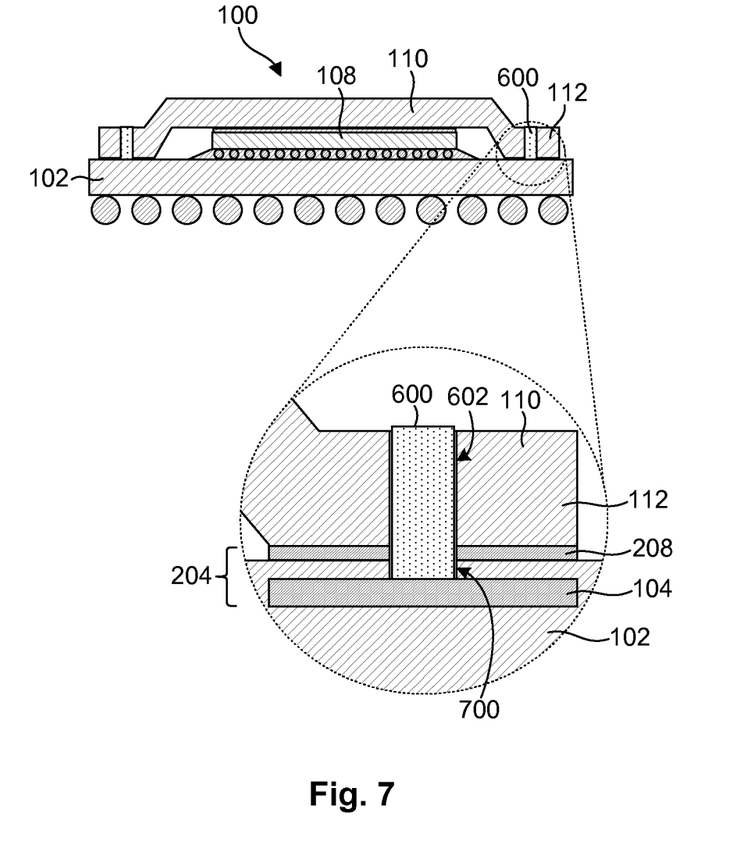
FIG. 7 is one possible cross-sectional side view of the apparatus of FIG. 6.

Referring to FIG. 7, a possible cross-sectional side view of the micro-electronic assembly 100 of FIG. 6 is illustrated. As shown, an electrically conductive post 600 such as a solder post 600 is electrically connected to a ground conductor 104 through an opening 700 in the substrate 102. This electrically conductive post 600 may fit through an aperture 602 in the electrically conductive lid 110 to electrically connect the lid 110 to the ground conductor 104. The lid 110 may be retained in place using any of the techniques discussed above in association with FIG. 6.

Figure 8:
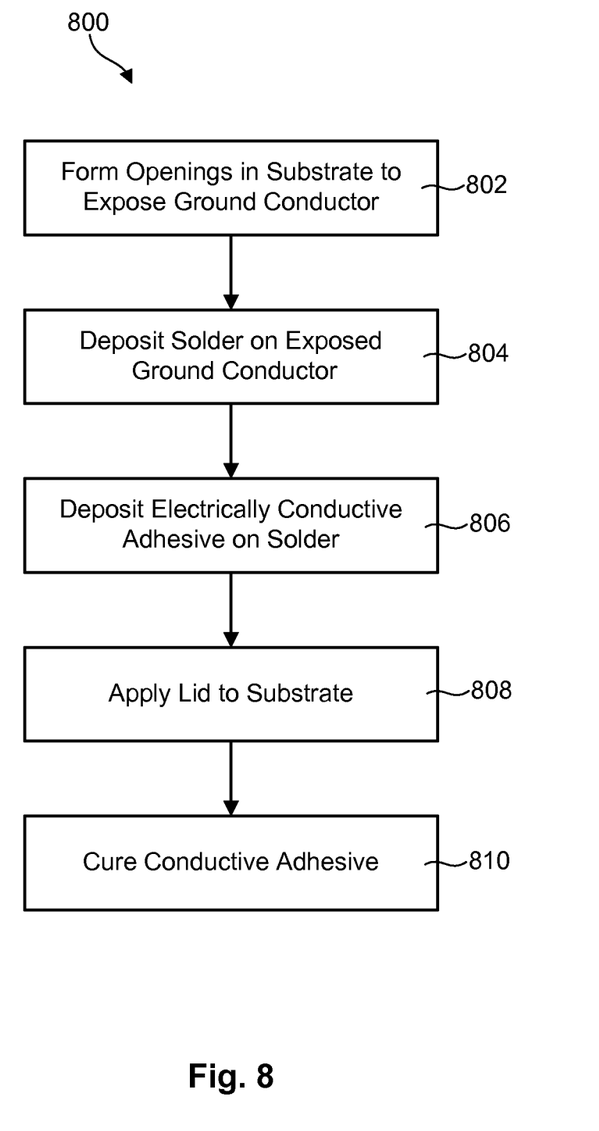
FIG. 8 is a flow chart showing one embodiment of a method capable of reducing EMI at the micro-electronic-component level.

Referring to FIG. 8, one embodiment of a method 800 for reducing EMI at the micro-electronic-component level is illustrated. As shown, the method 800 may initially form 802 one or more openings 106 in a substrate 102 to expose a ground conductor 104. Next, the method 800 may deposit 804 solder on the exposed ground conductor 104. A solder may be selected that creates a good mechanical bond and electrical connection with the ground conductor 104 and an electrically conductive adhesive 114. The method 800 may then deposit 806 the electrically conductive adhesive 114 on the solder. Alternatively, the method 800 may deposit the electrically conductive adhesive 114 on the lid 110, such as along the flange 112, as previously discussed.

The electrically conductive adhesive 114 may, in certain embodiments, be deposited exclusively at locations where the solder 206 is present (as shown, for example, in FIG. 4) or be deposited in the form of a ring around the micro-electronic component 108 (as shown, for example, in FIGS. 1 and 5). The electrically conductive lid 110 may then be applied 808 to the substrate 102. The electrically conductive adhesive 114 may then be allowed to cure 810. In certain embodiments, the electrically conductive lid 110 is held in place while the electrically conductive adhesive 114 cures 810.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. All changes which come within the meaning and range of equivalency of the claims are to be embraced within their scope.

The invention claimed is:

1. An apparatus for reducing EMI at the micro-electronic-component level, the apparatus comprising:
    a substrate having a ground conductor integrated therein;
    a micro-electronic component mounted to the substrate;
    an electrically conductive lid mounted to the substrate and thereby forming a physical interface with the substrate, the electrically conductive lid substantially covering the micro-electronic component; and
    a conductive link creating an electrical connection between the electrically conductive lid and the ground conductor at the physical interface,
    wherein the conductive link comprises a first solder layer on the ground conductor, a second solder layer on the electrically conductive lid, and an electrically conductive adhesive between the first and second solder layers.

2. The apparatus of claim 1, wherein the conductive link comprises an electrically conductive adhesive between the electrically conductive lid and the ground conductor.

3. The apparatus of claim 1, wherein the conductive link comprises a solder layer on the ground conductor, and an electrically conductive adhesive between the solder layer and the electrically conductive lid.

4. The apparatus of claim 3, wherein the electrically conductive adhesive is a resin-based adhesive filled with an electrically conductive material.

5. The apparatus of claim 1, wherein the conductive link comprises a solder post extending through an aperture in the electrically conductive lid.

6. The apparatus of claim 1, wherein the conductive link comprises a solder layer extending between the electrically conductive lid and the ground conductor.

7. The apparatus of claim 1, wherein the conductive link forms a conductive ring around the micro-electronic component.

8. The apparatus of claim 1, wherein multiple openings are provided in the substrate to expose the ground conductor.

9. The apparatus of claim 1, wherein a single opening in the form of a ring is provided in the substrate to expose the ground conductor.

10. A method for reducing EMI at the micro-electronic-component level, the method comprising:
    providing a substrate having a ground conductor integrated therein;
    mounting a micro-electronic component to the substrate;
    mounting an electrically conductive lid to the substrate and thereby forming a physical interface, the electrically conductive lid substantially covering the micro-electronic component; and
    electrically connecting the electrically conductive lid to the ground conductor at the physical interface,
    wherein the electrically connecting the electrically conductive lid to the ground conductor step comprises applying a first solder layer on the ground conductor, applying a second solder layer on the electrically conductive lid, and adhering the first solder layer to the second solder layer using an electrically conductive adhesive.

11. The method of claim 10, wherein the electrically connecting the electrically conductive lid to the ground conductor step comprises adhering the electrically conductive lid to the ground conductor using an electrically conductive adhesive.

12. The method of claim 10, wherein the electrically connecting the electrically conductive lid to the ground conductor step comprises applying a solder layer on the ground conductor, and adhering the solder layer to the electrically conductive lid using an electrically conductive adhesive.

13. The method of claim 12, wherein the electrically conductive adhesive comprises a resin-based adhesive filled with an electrically conductive material.

14. The method of claim 10, wherein the electrically connecting the electrically conductive lid to the ground conductor step comprises extending a solder post, connected to the ground conductor, through an opening in the electrically conductive lid.

15. The method of claim 10, wherein the electrically connecting the electrically conductive lid to the ground conductor step comprises forming a solder layer from the electrically conductive lid to the ground conductor.

16. The method of claim 10, wherein the electrically connecting the electrically conductive lid to the ground conductor step comprises forming a ring of electrically conductive adhesive around the micro-electronic component.

17. The method of claim 10, wherein the providing a substrate having a ground conductor integrated therein step comprises forming multiple openings in the substrate to expose the ground conductor.

18. The method of claim 10, wherein the providing a substrate having a ground conductor integrated therein step comprises forming a ring-shaped opening in the substrate to expose the ground conductor.

* * * * *